US008594245B2

United States Patent
Yu et al.

(10) Patent No.: US 8,594,245 B2
(45) Date of Patent: *Nov. 26, 2013

(54) DIGITAL BROADCASTING RECEIVING SYSTEM AND METHOD

(75) Inventors: Yung-pil Yu, Suwon-si (KR); Hae-joo Jeong, Seoul (KR); Eui-jun Park, Seoul (KR); Joon-soo Kim, Seoul (KR); Yong-sik Kwon, Seoul (KR); Jin-Hee Jeong, Anyang-si (KR); Yong-deok Chang, Suwon-si (KR); Kum-ran Ji, Seoul (KR); Jong-hun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1398 days.

This patent is subject to a terminal disclaimer.

(21) Appl. No.: 11/504,031

(22) Filed: Aug. 15, 2006

(65) Prior Publication Data

US 2007/0092043 A1 Apr. 26, 2007

Related U.S. Application Data

(60) Provisional application No. 60/728,777, filed on Oct. 21, 2005, provisional application No. 60/734,295, filed on Nov. 8, 2005, provisional application No. 60/738,050, filed on Nov. 21, 2005, provisional application No. 60/739,448, filed on Nov. 25, 2005, provisional application No. 60/788,707, filed on Apr. 4, 2006.

(30) Foreign Application Priority Data

Jul. 20, 2006 (KR) .................. 10-2006-0068064

(51) Int. Cl.
*H03D 1/00* (2006.01)
(52) U.S. Cl.
USPC ........... 375/340; 375/130; 375/240; 714/795; 714/704; 714/784

(58) Field of Classification Search
USPC ................. 375/340, 321, 130, 270, 240, 259; 714/804, 704, 776, 781, 786, 784, 798; 348/51, 426
See application file for complete search history.

(56) References Cited

U.S. PATENT DOCUMENTS

| 6,578,171 B1 | 6/2003 | Braneci et al. |
| 6,732,324 B2 * | 5/2004 | Koppelaar .................... 714/784 |

(Continued)

FOREIGN PATENT DOCUMENTS

| CA | 2677963 A1 | 11/2005 |
| CA | 2677967 A1 | 11/2005 |

(Continued)

OTHER PUBLICATIONS

Sung-Hoon Kim et al., "Enhanced-xVSB System Development for Improving ATSC Terrestrial DTV Transmission Standard," *IEEE Transactions on Broadcasting*, vol. 52, No. 2, Jun. 2006, pp. 129-136.

(Continued)

*Primary Examiner* — Eva Puente
(74) *Attorney, Agent, or Firm* — Sughrue Mion, PLLC

(57) ABSTRACT

A digital broadcasting receiving system and method, where the digital broadcasting receiving system includes: a demodulator receiving and demodulating a dual transmission stream including a turbo stream and a normal stream; an equalizer equalizing the demodulated dual transmission stream; a first processor restoring normal stream data from the equalized dual transmission stream; and a second processor restoring turbo stream data from the equalized dual transmission stream and eraser decoding the turbo stream data. Thus, the reception sensitivity of a transmission stream including a turbo stream can be improved.

12 Claims, 6 Drawing Sheets

(56) References Cited

U.S. PATENT DOCUMENTS

| | | | |
|---|---|---|---|
| 7,159,169 B2* | 1/2007 | Honary et al. | 714/795 |
| 2002/0154709 A1* | 10/2002 | Choi et al. | 375/301 |
| 2002/0194570 A1 | 12/2002 | Birru et al. | |
| 2004/0057535 A1 | 3/2004 | Strolle et al. | |
| 2004/0100937 A1* | 5/2004 | Chen | 370/345 |
| 2005/0060632 A1 | 3/2005 | Honary et al. | |
| 2005/0097428 A1 | 5/2005 | Chang et al. | |
| 2005/0111586 A1* | 5/2005 | Kang et al. | 375/321 |
| 2006/0015801 A1* | 1/2006 | Suh et al. | 714/804 |
| 2006/0212782 A1* | 9/2006 | Li | 714/784 |
| 2009/0046795 A1* | 2/2009 | Park et al. | 375/265 |
| 2009/0052523 A1* | 2/2009 | Song et al. | 375/240.01 |
| 2009/0060025 A1* | 3/2009 | Song et al. | 375/240 |
| 2009/0060054 A1* | 3/2009 | Song et al. | 375/240.25 |
| 2009/0060058 A1* | 3/2009 | Yu | 375/240.28 |
| 2009/0063695 A1* | 3/2009 | Song et al. | 709/231 |

FOREIGN PATENT DOCUMENTS

| | | |
|---|---|---|
| JP | 10-322228 A | 12/1998 |
| JP | 2000224121 A | 8/2000 |
| JP | 2001285080 A | 10/2001 |
| KR | 10-2005-0107287 A | 11/2005 |
| KR | 10-2005-0109052 A | 11/2005 |
| WO | 2004/043073 A1 | 5/2004 |
| WO | 2004/066301 A1 | 8/2004 |
| WO | 2005071958 A1 | 8/2005 |
| WO | WO 2006/101359 A1 | 9/2006 |

OTHER PUBLICATIONS

International Search Report mailed on Feb. 5, 2007, in International Application No. PCT/KR2006/004321.
Written Opinion of the International Searching Authority mailed on Feb. 5, 2007, in International Application No. PCT/KR2006/004321.
U.S. Appl. No. 11/416,254, filed May 3, 2006, Jung-pil Yu et al., Samsung Electronics Co., Ltd.
U.S. Appl. No. 11/416,258, filed May 3, 2006, Yong-sik Kwon et al., Samsung Electronics Co., Ltd.
U.S. Appl. No. 11/416,457, filed May 3, 2006, Jung-pil Yu et al., Samsung Electronics Co., Ltd.
U.S. Appl. No. 11/503,970, filed Aug. 15, 2006, Jung-pil Yu et al., Samsung Electronics Co., Ltd.
U.S. Appl. No. 11/504,024, filed Aug. 15, 2006, Jung-pil Yu et al., Samsung Electronics Co., Ltd.
U.S. Appl. No. 11/504,027, filed Aug. 15, 2006, Jung-pil Yu et al., Samsung Electronics Co., Ltd.
U.S. Appl. No. 11/504,029, filed Aug. 15, 2006, Jung-pil Yu et al., Samsung Electronics Co., Ltd.
U.S. Appl. No. 11/504,030, filed Aug. 15, 2006, Jung-pil Yu et al., Samsung Electronics Co., Ltd.
U.S. Appl. No. 11/504,038, filed Aug. 15, 2006, Jung-pil Yu et al., Samsung Electronics Co., Ltd.
U.S. Appl. No. 11/504,651, filed Aug. 16, 2006, Jung-pil Yu et al., Samsung Electronics Co., Ltd.
U.S. Appl. No. 11/504,724, filed Aug. 16, 2006, Jung-pil Yu et al., Samsung Electronics Co., Ltd.
U.S. Appl. No. 11/504,725, filed Aug. 16, 2006, Jung-pil Yu et al., Samsung Electronics Co., Ltd.
U.S. Appl. No. 11/504,726, filed Aug. 16, 2006, Jung-pil Yu et al., Samsung Electronics Co., Ltd.
U.S. Appl. No. 11/505,369, filed Aug. 17, 2006, Jung-pil Yu et al., Samsung Electronics Co., Ltd.
U.S. Appl. No. 11/505,894, filed Aug. 18, 2006, Eui-jun Park et al., Samsung Electronics Co., Ltd.
U.S. Appl. No. 11/508,144, filed Aug. 23, 2006, Jung-pil Yu et al., Samsung Electronics Co., Ltd.
U.S. Appl. No. 11/523,716, filed Sep. 20, 2006, Jung-pil Yu et al., Samsung Electronics Co., Ltd.
U.S. Appl. No. 11/692,509, filed Mar. 28, 2007, Hae-joo Jeong et al., Samsung Electronics Co., Ltd.
Chinese Office Action issued on Jul. 10, 2009, in related Application No. 200680035188.
Communication dated Jan. 4, 2012 issued by the Japanese Patent Office in counterpart Japanese Application No. 2008-536519.
"ATSC Standard: Digital Television Standard (A/53), Revision D, Including Amendment No. 1", Advanced Television Systems Committee, Jul. 19, 2005, 40 pages.
Notice of Allowance issued Mar. 20, 2012 by the Korean Intellectual Property Office in counterpart Korean Patent Application No. 10-2008-0036860.
Communication, dated Jun. 14, 2013, issued by the Canadian Intellectual Property Office in counterpart Canadian Patent Application No. 2,625,407.

* cited by examiner

| SYNC | PID | Turbo Data |
|------|-----|------------|
| SYNC | PID | Normal Data |
| SYNC | PID | Normal Data |
| SYNC | PID | Normal Data |

1  3  184

DIGITAL BROADCASTING RECEIVING SYSTEM AND METHOD

CROSS-REFERENCE TO RELATED APPLICATIONS

This application claims the benefit of Korean Application No. 2006-68064, filed Jul. 20, 2006, in the Korean Intellectual Property Office, and U.S. Provisional Application No. 60/728,777 filed Oct. 21, 2005, U.S. Provisional Application No. 60/734,295 filed Nov. 8, 2005, U.S. Provisional Application No. 60/738,050 filed Nov. 21, 2005, U.S. Provisional Application No. 60/739,448 filed Nov. 25, 2005, and U.S. Provisional Application No. 60/788,707 filed Apr. 4, 2006 filed in the United States Patent and Trademark Office, the disclosures of which are incorporated herein by reference.

BACKGROUND OF THE INVENTION

1. Field of the Invention

An aspect of the present invention relates to a digital broadcasting receiving system and method for receiving a transmission stream used for digital broadcasting, and more particularly, to a digital broadcasting receiving system and method for receiving and processing a dual transmission stream including a normal stream and a turbo stream.

2. Description of the Related Art

An Advanced Television Systems Committee Vestigial Sideband (ATSC VSB) way, which is a United States terrestrial digital television (DTV) system, is a single carrier way and uses field sync at intervals of 312 segments. Thus, reception sensitivity is poor in a poor channel, particularly, in a Doppler fading channel.

FIG. 1 is a block diagram of a digital broadcasting transmitting and receiving system according to standards of an Advanced Television Systems Committee Digital Television (ATSC DTV) in a general United States terrestrial digital broadcasting system. The digital broadcasting transmitter of the digital broadcasting transmitting and receiving system, shown in FIG. 1, is an enhanced Vestigial Sideband (EVSB) system suggested by Philips and forms and transmits a dual stream including normal data of a standard ATSC VSB system to which robust data is added.

Referring to FIG. 1, the digital broadcasting transmitter includes a randomizer 11, a Reed-Solomon (RS) encoder 12, an interleaver 13, and a 2/3 rate trellis encoder 14 to perform error correction coding (ECC) on the dual stream. The randomizer 11 randomizes the dual stream. The RS encoder 12 is a concatenated coder adding parity bytes to a transmission stream to correct an error occurring in a transmission process due to channel characteristics. The interleaver 13 interleaves RS encoded data according to a predetermined pattern. The 2/3 trellis encoder 14 trellis encodes the interleaved data at a rate of 2/3, to map the interleaved data as 8-level symbols.

The digital broadcasting transmitter further includes a multiplexer 15 and a modulator 16. The multiplexer 15 inserts field sync and segment sync into the data on which ECC has been performed in a data format shown in FIG. 2. The modulator 16 adds a predetermined direct current (DC) value to data symbols, into which segment sync and field sync have been inserted, in order to insert pilot tones and shape pulses so as to perform a VSB modulation on the data symbols and up-convert the data symbols into a signal in a radio frequency (RF) channel band.

Thus, in the digital broadcasting transmitter, normal data and robust data are multiplexed and input to the randomizer 11 using a dual stream way of transmitting normal data and robust data through a channel. The input data is randomized by the randomizer 11, outer encoded by the RS encoder 12 as an outer coder, and interleaved by the interleaver 13. Also, the interleaved data is inner encoded by the trellis encoder 14 in a unit of 12 symbols and mapped as 8-level symbols. Next, field sync and segment sync are inserted into the 8-level symbols. Pilot tones are inserted into the 8-level symbols to perform a VSB modulation on the 8-level symbols, up-convert the 8-level symbols into an RF signal, and transmit the RF signal.

The digital broadcasting receiver of the digital broadcasting system shown in FIG. 1 includes a tuner (not shown), a demodulator 21, an equalizer 22, a viterbi decoder 23, a deinterleaver 24, an RS decoder 25, and a derandomizer 26. The tuner (not shown), converts the RF signal received through a channel into a baseband signal. The demodulator 21 detects sync from the baseband signal which is transmitted by the channel and demodulates the baseband signal. The equalizer 22 compensates for a channel distortion of the demodulated signal caused by a multi-path and outputs an equalized signal to the viterbi decoder 23. The viterbi decoder 23 performs ECC on the equalized signal and demodulates the equalized signal into symbol data. The deinterleaver 24 re-arranges the data interleaved by the interleaver 13 of the digital broadcasting transmitter. The RS decoder 25 performs an error correction on the re-arranged data. The derandomizer 26 derandomizes the data error corrected by the RS decoder 25 and outputs a Moving Picture Experts Group-2 (MPEG-2) transmission stream.

Accordingly, the digital broadcasting receiver shown in FIG. 1 performs a reverse process performed by the digital broadcasting transmitter. In other words, the broadcasting receiver down-converts the RF signal into the baseband signal, demodulates and equalizes the baseband signal, and channel decodes the demodulated and equalized signal to restore an original signal.

FIG. 2 is a view illustrating a VSB data frame of a United States digital broadcasting (8-VSB) system in which a segment sync and a field sync are inserted. As shown in FIG. 2, one frame includes two fields, and each field includes a field sync segment and 312 data segments. Also, in the VSB data frame, one segment corresponds to an MPEG-2 packet and includes a segment sync having 4 symbols and 828 data symbols.

Referring to FIG. 2, a segment sync signal and a field sync signal are used for synchronization and equalization in the digital broadcasting receiver. In other words, a field sync signal and a segment sync signal are recognized by the digital broadcasting transmitter and the digital broadcasting receiver and used as reference signals for the equalization in the digital broadcasting receiver.

In the United States terrestrial broadcasting system shown in FIG. 1, robust data is added to normal data of an existing ATSC VSB system to form and transmit a dual stream. Here, existing normal data is transmitted together with robust data.

However, the United States terrestrial digital broadcasting system shown in FIG. 1 has almost no effect on improving the inferior reception performance in a multipath channel, due to the transmission of the existing normal data, although it transmits the dual stream produced by adding the robust data to the normal data. In other words, the improvement of a normal stream hardly contributes to improving the reception sensitivity. Also, a turbo stream cannot greatly contribute to improving reception sensitivity in a multi-path environment.

Accordingly, a system and a method for receiving and processing a dual transmission stream including a robustly processed turbo stream and a normal stream are required.

SUMMARY OF THE INVENTION

Accordingly, the present general inventive concept has been made to solve the above-mentioned and/or other problems, and an aspect of the present general inventive concept provides a digital broadcasting receiving system and method for receiving a dual transmission stream including a normal stream and a robustly processed turbo stream to restore the turbo stream and the normal stream and eraser decoding the restored turbo stream to remove noise, so as to improve reception sensitivity of an Advanced Television Systems Committee Vestigial Sideband (ATSC VSB) way, such as in the United States terrestrial digital television (DTV) system.

According to an aspect of the present invention, there is provided a digital broadcasting receiving system including: a demodulator receiving and demodulating a dual transmission stream including a turbo stream and a normal stream; an equalizer equalizing the demodulated dual transmission stream; a first processor restoring normal stream data from the equalized dual transmission stream; and a second processor restoring turbo stream data from the equalized dual transmission stream and eraser decoding the turbo stream data.

According to another aspect of the present invention, the first processor may include: a viterbi decoder performing an error correction on the normal stream of the equalized dual transmission stream and decoding the error corrected normal stream; a first deinterleaver deinterleaving the dual transmission stream output from the viterbi decoder; an RS (Reed-Solomon) decoder RS decoding the deinterleaved dual transmission stream; and a first derandomizer derandomizing the RS decoded dual transmission stream to restore the normal stream data.

According to another aspect of the present invention, the second processor may include: a turbo decoder turbo decoding the turbo stream of the equalized dual transmission stream; a second deinterleaver deinterleaving the dual transmission stream including the turbo decoded turbo stream; a parity remover removing parity from the dual transmission stream deinterleaved by the second deinterleaver; a second derandomizer derandomizing the dual transmission stream from which the parity has been removed; a turbo demultiplexer demultiplexing the derandomized dual transmission stream to restore the turbo stream data; and an eraser decoder eraser decoding the restored turbo stream data.

According to another aspect of the present invention, the turbo decoder may include: a trellis decoder trellis decoding the turbo stream of the equalized dual transmission stream; an outer deinterleaver deinterleaving the trellis decoded turbo stream; an outer map decoder decoding the deinterleaved turbo stream; an outer interleaver interleaving the turbo stream decoded by the outer map decoder and providing the interleaved turbo stream to the trellis decoder if the outer map decoder outputs a soft decision output value; and a frame formatter frame formatting a hard decision output value output from the outer map decoder.

According to another aspect of the present invention, the turbo decoder may further include a symbol deinterleaver converting the frame formatted turbo stream from a symbol unit into a byte unit and providing the turbo stream to the second deinterleaver.

According to another aspect of the present invention, there is provided a digital broadcasting receiving method including: receiving and demodulating a dual transmission stream including a turbo stream and a normal stream; equalizing the demodulated dual transmission stream; restoring normal stream data from the equalized dual transmission stream; and restoring turbo stream data from the equalized dual transmission stream and eraser decoding the turbo stream data.

According to another aspect of the present invention, the restoring of the normal stream data from the equalized dual transmission stream may include: performing an error correction on the normal stream of the equalized dual transmission stream and decoding the error corrected normal stream; deinterleaving the dual transmission stream including the viterbi decoded normal stream; RS decoding the deinterleaved dual transmission stream; and derandomizing the RS decoded dual transmission stream to restore the normal stream data.

According to another aspect of the present invention, the restoring of the turbo stream data from the equalized dual transmission stream and the eraser decoding of the turbo stream data may include: turbo decoding the turbo stream of the equalized dual transmission stream; deinterleaving the dual transmission stream including the turbo decoded turbo stream; removing parity from the deinterleaved dual transmission stream; derandomizing the dual transmission stream from which the parity has been removed; demultiplexing the derandomized dual transmission stream to restore the turbo stream data; and eraser decoding the restored turbo stream data.

According to another aspect of the present invention, the turbo decoding of the turbo stream of the equalized dual transmission stream may include: trellis decoding the turbo stream of the equalized dual transmission stream using a trellis decoder; deinterleaving the trellis decoded turbo stream; decoding the deinterleaved turbo stream; if a soft decision output value is output in the decoding of the deinterleaved turbo stream, interleaving the decoded turbo stream and providing the interleaved turbo stream to the trellis decoder; and if a hard decision output value is output in the decoding of the deinterleaved turbo stream, frame formatting the hard decision output value.

According to another aspect of the present invention, the turbo decoding of the turbo stream of the equalized dual transmission stream may further include converting the frame formatted turbo stream from a symbol unit into a byte unit.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
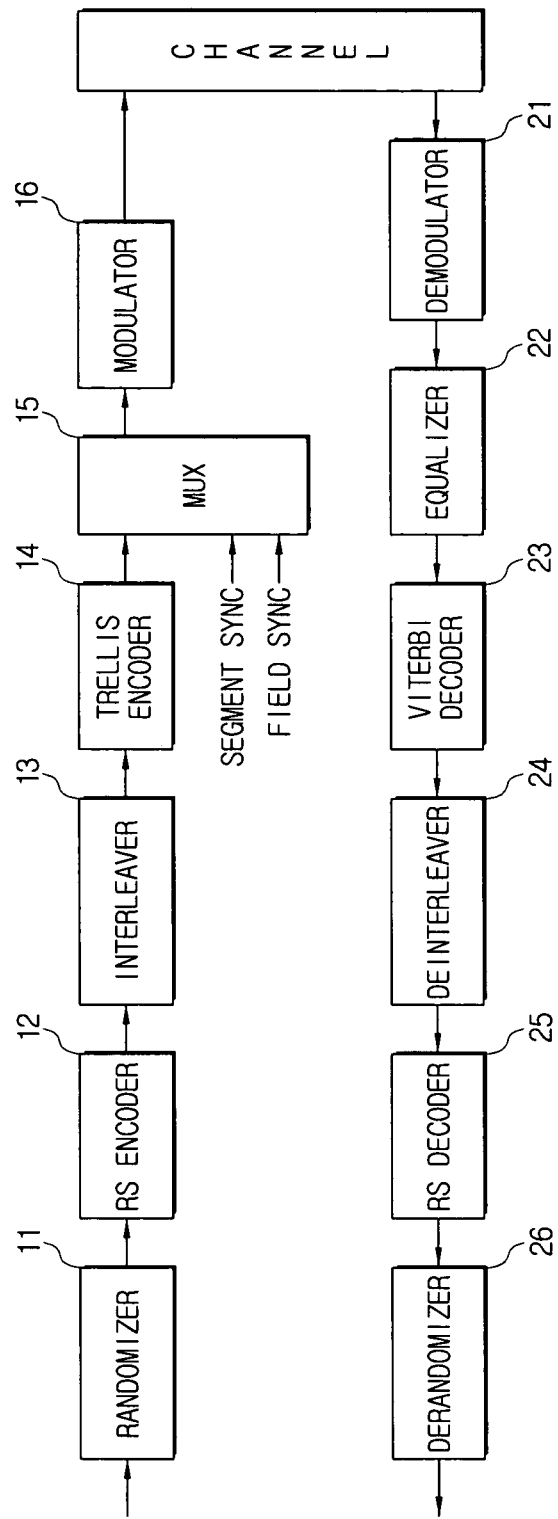
FIG. 1 is a block diagram illustrating a configuration of a conventional digital broadcasting (ATSC VSB) transmitting and receiving system.
Figure 2:
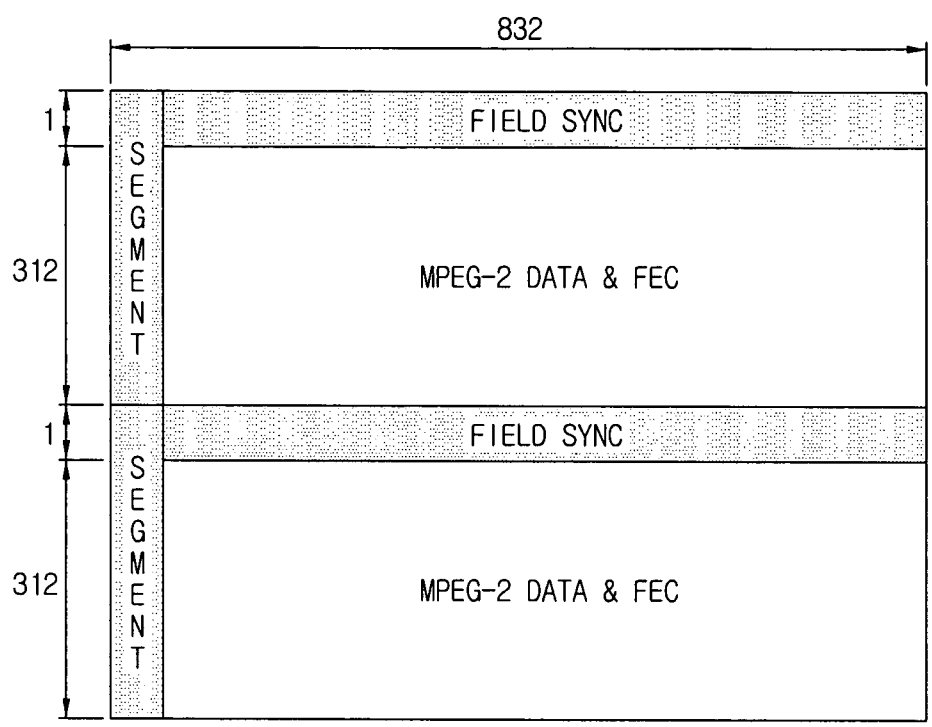
FIG. 2 is a view illustrating a frame structure of conventional Advanced Television Systems Committee Vestigial Sideband (ATSC VSB) data.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

In the following description, same drawing reference numerals are used for the same elements even in different drawings. The matters defined in the description such as a detailed construction and elements are nothing but the ones provided to assist in a comprehensive understanding of the invention. Thus, it is apparent that the aspects of the present invention can be carried out without those defined matters. Also, well-known functions or constructions are not described in detail since they would obscure the invention in unnecessary detail.

Figure 3:
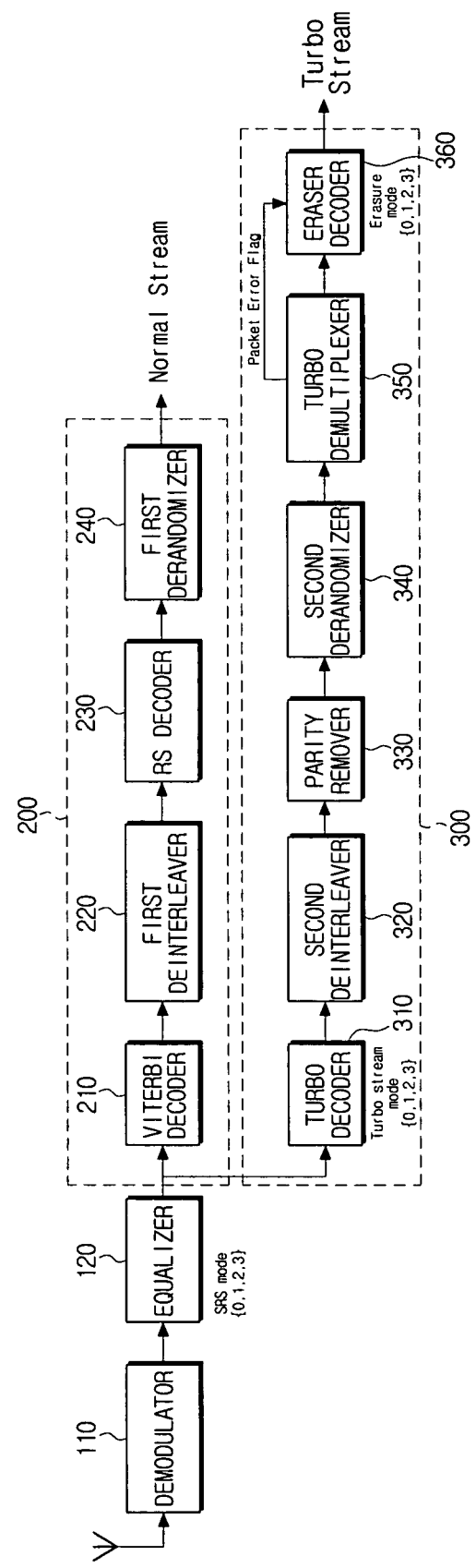
FIG. 3 is a block diagram illustrating a configuration of a digital broadcasting receiving system according to an embodiment of the present invention.

FIG. 3 is a block diagram illustrating a configuration of a digital broadcasting receiving system according to an embodiment of the present invention. Referring to FIG. 3, the digital broadcasting receiving system includes a demodulator 110, an equalizer 120, and first and second processors 200 and 300.

The digital broadcasting receiving system receives and processes a dual transmission stream. The dual transmission stream is a transmission stream including a turbo stream and a normal stream. A transmitter (not shown) may detect and encode the turbo stream separately from the dual transmission stream, and insert the encoded turbo stream into the dual transmission stream, so as to process and transmit the dual transmission stream. The turbo stream refers to a data stream compressed and robustly processed according to predetermined compression standards such as Moving Pictures Experts Group-2 (MPEG-2) standards. The turbo stream data may be audio data, video data, or the like.

The demodulator 110 detects a sync according to a sync signal added to a baseband signal of the received dual transmission stream and performs a demodulation.

The equalizer 120 equalizes the demodulated dual transmission stream to compensate for a distortion of a channel caused by a multi-path of the channel. The dual transmission stream equalized by the equalizer 120 is provided to the first and second processors 200 and 300.

The first processor 200 processes the normal stream of the dual transmission stream to restore normal stream data. Referring to FIG. 3, the first processor 200 includes a viterbi decoder 210, a first deinterleaver 220, a Reed-Solomon (RS) decoder 230, and a first derandomizer 240.

The viterbi decode 210 performs an error correction on the normal stream of the equalized dual transmission stream and demodulates error corrected symbols to output demodulated symbol packets.

The first deinterleaver 220 deinterleaves the demodulated symbol packets to re-arrange distributed packets and outputs a deinterleaved normal stream packet.

The RS decoder 230 RS decodes the deinterleaved normal stream packet to correct an error and outputs an RS decoded normal stream packet.

The first derandomizer 240 derandomizes the RS decoded normal stream packet to restore the normal stream data.

The second processor 300 processes the turbo stream of the dual transmission stream to restore turbo stream data. Referring to FIG. 3, the second processor 300 includes a turbo decoder 310, a second deinterleaver 320, a parity remover 330, a second derandomizer 340, a turbo demultiplexer 350, and an eraser decoder 360.

The turbo decoder 310 turbo decodes only the turbo stream of the equalized dual transmission stream. The turbo decoding is a process of decoding the turbo stream. The turbo decoder 310 may detect a portion of a packet adaptation field of the dual transmission stream or the whole packet adaptation field and turbo decode the turbo stream. The packet adaptation field is an area formed in each packet of the dual transmission stream in which an SRS, turbo stream data, and the like may be recorded. If the turbo decoder 310 completely turbo decodes the turbo stream, the turbo decoder 310 re-inserts the turbo decoded turbo stream into the dual transmission stream to reconstitute the dual transmission stream.

The second deinterleaver 320 deinterleaves the reconstituted dual transmission stream to re-arrange packets.

The parity remover 330 removes parity from the deinterleaved dual transmission stream.

The second derandomizer 340 derandomizes the dual transmission stream from which the parity has been removed.

The turbo demultiplexer 350 demultiplexes the derandomized dual transmission stream to restore the turbo stream data.

The eraser decoder 360 eraser decodes the restored turbo stream data. The transmitter performs eraser encoding to remove noise from the turbo stream and inserts the turbo stream into the normal stream to generate and transmit the dual transmission stream. Thus, the eraser decoder 360 eraser decodes the eraser encoded turbo stream to remove noise from the turbo stream so as to improve reception sensitivity.

The second processor 300 of the digital broadcasting receiving system shown in FIG. 3 may further include an RS decoder (not shown) RS decoding the deinterleaved turbo stream.

Figure 4:
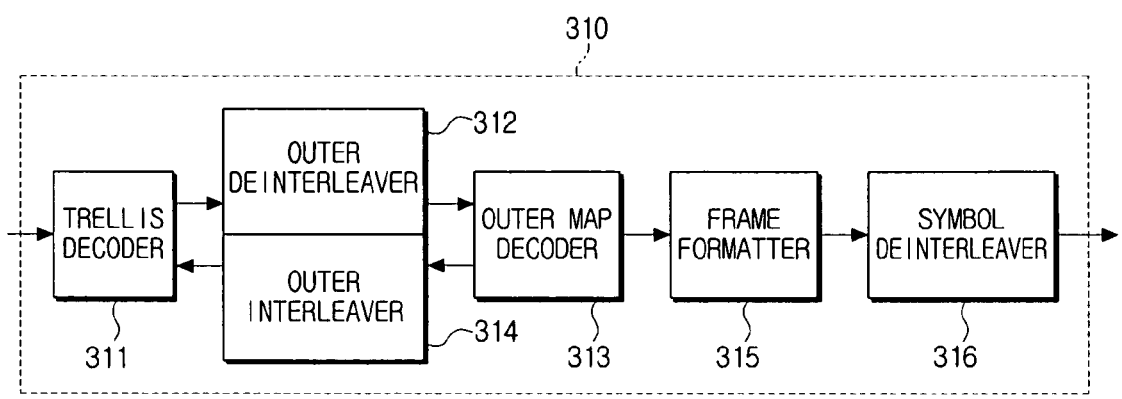
FIG. 4 is a block diagram illustrating a configuration of a turbo decoder of the digital broadcasting receiving system shown in FIG. 3, according to an embodiment of the present invention.

FIG. 4 is a block diagram illustrating a configuration of the turbo decoder 310 according to an embodiment of the present invention. Referring to FIG. 4, the turbo decoder 310 includes a trellis decoder 311, an outer deinterleaver 312, an outer map decoder 313, an outer interleaver 314, a frame formatter 315, and a symbol deinterleaver 316.

The trellis decoder 311 trellis decodes the turbo stream of the equalized dual transmission stream and provides the trellis decoded turbo stream to the outer deinterleaver 312.

The outer deinterleaver 312 deinterleaves the trellis decoded turbo stream.

The outer map decoder 313 may convolution decode the deintereaved turbo stream. The outer map decoder 313 outputs soft decision and hard decision output values depending on the result of the convolution decoding. Here, soft and hard decisions depend on a matrix of the turbo stream. For example, if the matrix of the turbo stream is "0.8," the soft decision output value is output as "0.8." If the matrix of the turbo stream is "1," the hard decision output value is output.

The hard decision output value of the outer map decoder 313 is provided to the frame formatter 315. In this case, the hard decision output value is the turbo stream.

The frame formatter 315 formats the convolution decoded hard decision turbo stream to a frame of the dual transmission stream.

The symbol deinterleaver 316 may detinterelave the frame formatted turbo stream from a symbol unit into a byte unit. The deinterleaving from the symbol unit into the byte unit may be easily understood with reference to Table D5.2 of US ATSC DTV Standards (A/53), and thus its detailed description will be omitted. Here, the symbol deinterleaver 316 may be omitted.

If the outer map decoder 313 outputs the soft decision output value, the outer interleaver 314 interleaves the turbo stream and provides the interleaved turbo stream to the trellis decoder 311. The trellis decoder 311 re-performs trellis decoding on the interleaved turbo stream and provides the trellis decoded turbo stream to the outer deinterleaver 312. The outer deinterleaver 312 re-deinterleaves the turbo stream and provides the re-deinterleaved turbo stream to the output map decoder 313. The operations of the trellis decoder 311, the outer deinterleaver 312, and the outer interleaver 314 may be repeatedly performed until the hard decision output value is output. Thus, a reliable decoded value can be obtained.

Figure 5:
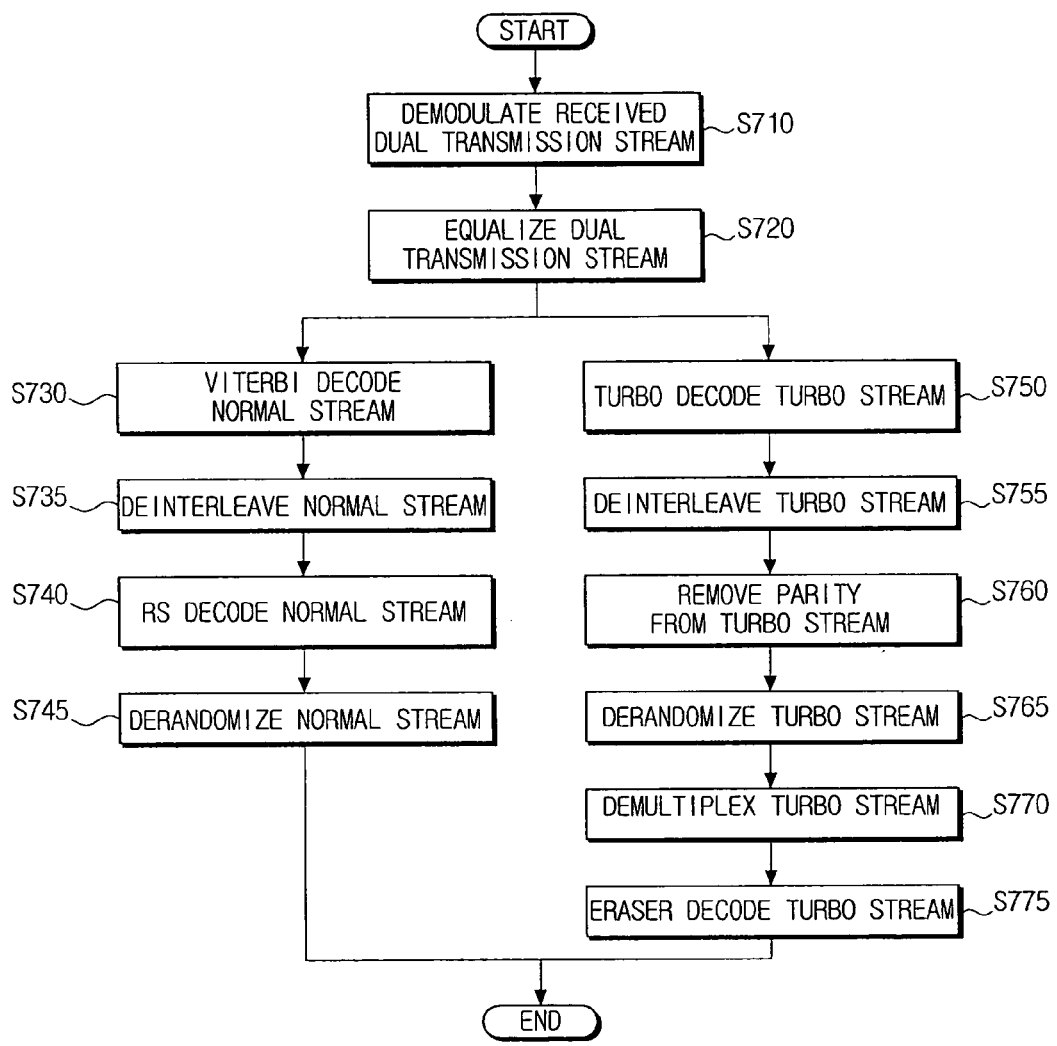
FIG. 5 is a flowchart illustrating a method of processing a digital broadcasting receiving signal according to an embodiment of the present invention.

FIG. 5 is a flowchart illustrating a method of processing a digital broadcasting receiving signal according to an embodiment of the present invention. Referring to FIG. 5, in operation S710, a dual transmission stream is received and demodulated. In operation S720, the demodulated dual transmission stream is equalized.

In operation S730, a normal stream of the equalized dual transmission stream is viterbi decoded. In operation S735, the viterbi decoded normal stream is deinterleaved. In operation S740, the deinterleaved normal stream is RS decoded. In operation S745, the RS decoded normal stream is derandomized to restore normal stream data.

In operation S750 a turbo stream of the equalized dual transmission stream is turbo decoded. In operation S755, the turbo decoded turbo stream is deinterleaved. In operation S760, parity is removed from the turbo stream. In operation S765, the turbo stream from which the parity has been removed is derandomized. In operation S770, the turbo stream is demultiplexed to detect the turbo stream from the derandomized dual transmission stream. In operation S775, the detected turbo stream, i.e., a turbo stream packet, is eraser decoded. Decoding of the turbo stream may be performed using a turbo decoder having a structure as shown in FIG. 4.

Figures 6, 7:
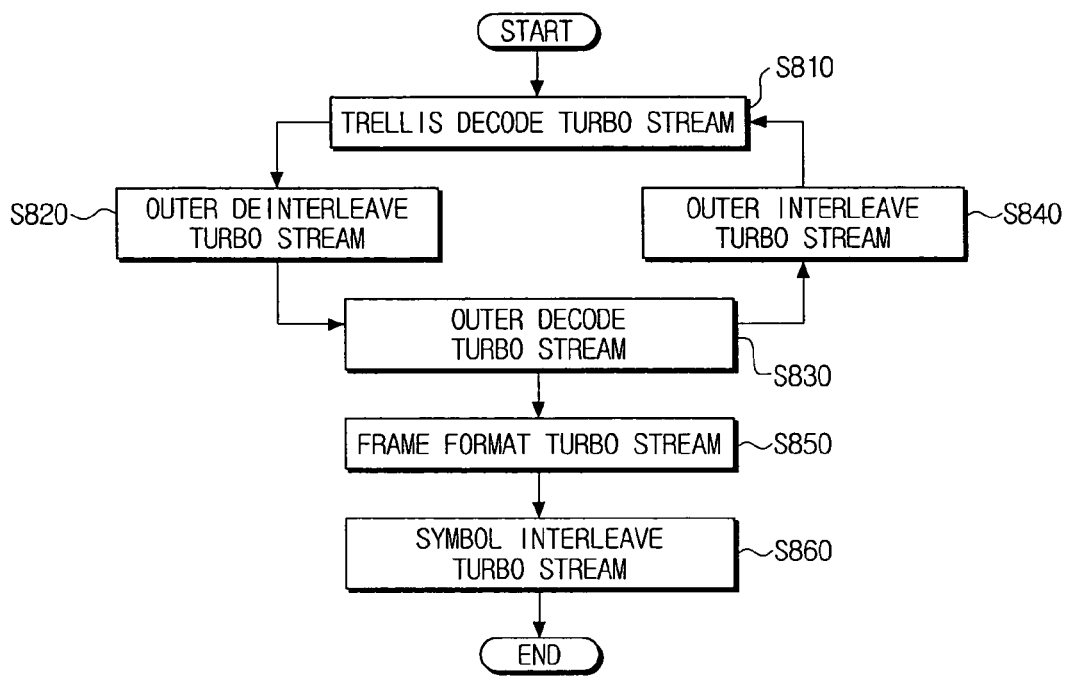
FIG. 6 is a flowchart illustrating a turbo decoding method according to an embodiment of the present invention.
FIG. 7 is a view illustrating a structure of a dual transmission stream received and processed by a digital broadcasting receiving system of an embodiment of the present invention.

FIG. 6 is a flowchart illustrating a turbo decoding method according to an embodiment of the present invention. Referring to FIG. 6, in operation S810, a turbo stream of a dual transmission stream is trellis decoded. In operation S820, the trellis decoded turbo stream is outer deinterleaved. In operation S830, the outer deinterleaved turbo stream is outer decoded.

If a hard decision output value is output through the outer decoding, the hard decision turbo stream is formatted to a frame of the dual transmission stream in operation S850. In operation S860, the frame formatted turbo stream is symbol interleaved.

If a soft decision output value is output through the outer decoding, the turbo stream is outer interleaved in operation S840. Operations S810 and 820 are re-performed to trellis decode and outer deinterleave the outer interleaved turbo stream. As a result, a reliable hard decision turbo stream can be obtained.

FIG. 7 is a view illustrating a structure of a dual transmission stream received and processed by a digital broadcasting receiving system according to an aspect of the present invention. Referring to FIG. 7, a dual transmission stream includes a plurality of consecutive packets. In detail, one packet includes a sync signal of 1 byte, a packet identity (PID) of 3 bytes, and a data area of 184 bytes. Referring to FIG. 7, robust data, i.e., a turbo stream, is disposed only in a predetermined packet of the dual transmission stream. In detail, in the dual transmission stream shown in FIG. 7, 78 packets of turbo streams are inserted into 312 packets of a field. In this case, a packet of turbo streams and three packets of normal streams are repeated in a ratio of 1:3 in the dual transmission stream. In other words, a packet (188 bytes) of turbo streams is sequentially connected to three packets (188 bytes) of normal streams. The structure of the dual transmission stream according to an aspect of the present invention may be modified into various forms.

As described above, according to an aspect of the present invention, a dual transmission stream including a normal stream and a robustly processed turbo stream can be received in order to restore the normal stream and the turbo stream. As a result, reception sensitivity of an Advanced Television Systems Committee Vestigial Sideband (ATSC VSB) way in a United States terrestrial digital television (DTV) system can be improved.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A digital broadcasting receiving system comprising:
    a demodulator receiving and demodulating a dual transmission stream comprising a turbo stream and a normal stream;
    an equalizer equalizing the demodulated dual transmission stream; and
    a processor processing turbo stream data from the equalized dual transmission stream ,
    wherein the processor comprises:
        a turbo decoder turbo decoding the turbo stream of the equalized dual transmission stream;
        a parity remover removing parity from the turbo stream turbo decoded by the turbo decoder, and
    wherein the turbo decoder trellis decodes, deinterleaves, decodes, and interleaves the turbo stream.

2. The digital broadcasting receiving system of claim 1, wherein the turbo decoder further comprises:
    a trellis decoder trellis decoding the turbo stream;
    a deinterleaver deinterleaving the trellis decoded turbo stream;
    an outer map decoder decoding the deinterleaved turbo stream;
    an outer interleaver interleaving the turbo stream decoded by the outer map decoder and providing the interleaved turbo stream to the trellis decoder if the outer map decoder outputs a soft decision output value; and
    a frame formatter frame formatting a hard decision output value output from the outer map decoder.

3. The digital broadcasting receiving system of claim 2, wherein the turbo decoder further comprises a symbol deinterleaver converting a frame formatted turbo stream, output from the frame formatter, from a symbol unit into a byte unit and providing the turbo stream to the deinterleaver.

4. A digital broadcasting receiving method comprising:
    receiving and demodulating a dual transmission stream including a turbo stream and a normal stream;
    equalizing the demodulated dual transmission stream; and
    processing turbo stream data from the equalized dual transmission stream,
    wherein the processing of the turbo stream data from the equalized dual transmission stream comprises:
        turbo decoding the turbo stream of the equalized dual transmission stream; and removing parity from the turbo decoded turbo stream, and wherein the turbo decoding of the turbo stream of the equalized dual transmission stream comprises:
- trellis decoding the turbo stream of the equalized dual transmission stream;
- deinterleaving the trellis decoded turbo stream;
- decoding the deinterleaved turbo stream; and
- interleaving the decoded turbo stream.

5. The digital broadcasting receiving method of claim 4, wherein the turbo decoding of the turbo stream of the equalized dual transmission stream further comprises:
- if a soft decision output value is output in the decoding of the deinterleaved turbo stream, interleaving the decoded turbo stream; and
- if a hard decision output value is output in the decoding of the deinterleaved turbo stream, frame formatting the hard decision output value.

6. The digital broadcasting receiving method of claim 4, wherein the turbo decoding of the turbo stream of the equalized dual transmission stream further comprises converting the frame formatted turbo stream from a symbol unit into a byte unit.

7. A digital broadcasting receiving system comprising:
- a demodulator receiving and demodulating a dual transmission stream including a normal stream and a turbo stream;
- an equalizer equalizing the demodulated dual transmission stream; and
- a processor processing the turbo stream and the normal stream, wherein the processor comprises a first processor processing normal stream data from the equalized dual transmission stream and a second processor processing turbo stream data from the equalized dual transmission stream, and wherein the second processor comprises:
- a turbo decoder turbo decoding the turbo stream of the equalized dual transmission stream; and
- a parity remover removing parity from the turbo stream decoded by the turbo decoder, and wherein the turbo decoder trellis decodes, deinterleaves, decodes, and interleaves the turbo stream.

8. The digital broadcasting receiving system of claim 7, wherein the turbo decoder detects a predetermined portion of the dual transmission stream and turbo decodes the turbo stream.

9. The digital broadcasting receiving system of claim 8, wherein the predetermined portion is an area formed in each packet of the dual transmission stream in which known data and turbo stream data are recorded.

10. The digital broadcasting receiving system of claim 7, wherein the turbo stream is a data stream compressed and robustly processed according to predetermined compression standards.

11. The digital broadcasting receiving system of claim 10, wherein the turbo stream data includes audio data and/or video data.

12. The digital broadcasting receiving system of claim 10, wherein the predetermined compression standards include an MPEG-2 standard.

* * * * *